March 31, 1964 D. E. A. HARVEY ETAL 3,127,562
TRANSISTOR FREQUENCY CONVERTER PROVIDING NEUTRALIZATION
OF DEGENERATING IMPEDANCE ELEMENTS
Filed Feb. 21, 1961
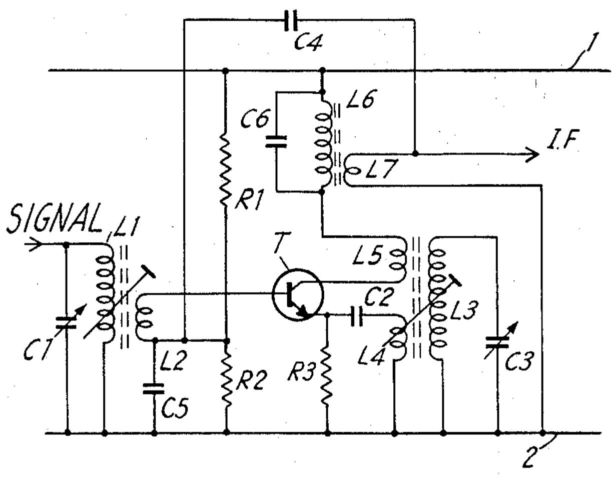
INVENTORS
Dennis Edwin Alfred Harvey
William James Pitt
BY
Larson and Taylor 3,127,562

TRANSISTOR FREQUENCY CONVERTER PROVIDING NEUTRALIZATION OF DEGENERATING IMPEDANCE ELEMENTS

Dennis Edwin Alfred Harvey, Enfield, and William James Pitts, Romford, England, assignors to Associated Electrical Industries Limited, London, England, a British company Filed Feb. 21, 1961, Ser. No. 90,873
Claims priority, application Great Britain Feb. 29, 1960
3 Claims. (Cl. 325—451)

This invention relates to frequency converter circuit arrangements and is particularly concerned with circuits employing transistors as the frequency converting elements.

One problem in the design of frequency converter circuits is that known as "squegging." This may take place when there is a resistance-capacitance parallel circuit in the heterodyne signal path of a self-oscillating frequency converting element. If the capacitance is greater than a certain critical value, intermittent blocking of the oscillator occurs which prevents its proper functioning as a heterodyne oscillator. The critical value of the capacitance is inversely related to the heterodyne frequency and thus, to prevent squegging at high heterodyne frequencies, the capacitance could have a value which presents a high impedance at the intermediate frequency. The degenerative effect of a high impedance at the intermediate frequency causes a loss of conversion gain in the frequency converter.

It is an object of the present invention to provide a circuit arrangement with improved conversion gain at high frequencies.

Accordingly the invention comprises a frequency converter circuit arrangement in which a heterodyne signal is produced by a self-oscillating frequency converter transistor and which has a positive feedback path from its output.

In carrying out the invention a frequency converter circuit arrangement can comprise a resonant circuit arranged to be tuned to resonate at the heterodyne frequency and coupled to a self-oscillating frequency converter transistor to which there is also coupled a resonant circuit arranged to be tuned at the frequency of the input signal, an output circuit tuned to resonate at the intermediate frequency, and a positive feedback path from the output circuit to the input signal resonant circuit.

In order that the invention may be more fully understood reference will now be made to the drawing accompanying this specification the single figure of which illustrates an embodiment of the invention.

Referring to the drawing a frequency converter circuit includes a transistor T which is connected as a self-oscillating converter. The input signal is applied to a tunable resonant circuit formed by inductance $L_1$ in parallel with variable capacitance $C_1$. The input signal is fed to transistor T by means of a coil $L_2$ which is inductively coupled to $L_1$ and is connected between the base of transistor T and a potential divider chain formed by resistors $R_1$ and $R_2$ connected across the supply lines 1 and 2 of the circuit. These resistors determine the static bias of the base of the transistor.

The heterodyne signal is generated in a tunable resonant circuit formed by inductance $L_3$ in parallel with variable capacitance $C_3$. The signal generated in this circuit is fed to transistor T through a coil $L_4$ inductively coupled to $L_3$ and which is connected to the emitter electrode of transistor T through a capacitive coupling $C_2$. Oscillations are maintained in the heterodyne circuit by means of a regenerative feedback coil $L_5$ connected in the collector circuit of the transistor and which is inductively coupled to coils $L_3$ and $L_4$. The emitter electrode is biased by means of a resistor $R_3$ through which the emitter current flows.

The output circuit of the mixer comprises a parallel resonant circuit formed by inductance $L_6$ and capacitance $C_6$ which resonates at the intermediate frequency (i.e. the difference frequency between the input signal frequency and the heterodyne frequency). The I.F. signal output is taken from a coil $L_7$ inductively coupled to $L_6$.

To prevent squegging in the above-described converter circuit it is necessary for capacitor $C_2$ to be smaller than a certain critical value. This may present a high impedance to intermediate frequency signals and thus reduce the conversion gain of the mixer. To improve the gain therefore positive feedback at the intermediate frequency is applied by connecting a coupling capacitor $C_4$ from output coil $L_7$ to the base of transistor T. The polarity of connections to the coil $L_7$ must be such that positive feedback is ensured. The unwanted feedback of signals at the input and heterodyne frequencies present across coil $L_7$ is reduced by connecting the capacitor $C_4$ to the junction of the base bias supply and $L_2$, instead of directly to the base, since this point has the lower impedance to the supply line 2 at these frequencies. $L_2$ has negligible impedance to the intermediate frequency and does not affect the feedback which is desired at the intermediate frequency. The degree of feedback is determined by the choice of values of capacitors $C_4$ and $C_5$.

What we claim is:

1. A frequency converter circuit arrangement comprising a pair of terminals, a signal path connected between the terminals including mutually in series a heterodyne signal inductive coupling network, a resistor-capacitor combination, a pair of electrodes of a transistor, a feedback coil and an output circuit including an inductance and a capacitance tuned to intermediate frequencies; heterodyne signal means for producing a self-oscillating frequency signal inductively coupled to said heterodyne signal coupling network and said feedback coil; an output signal means inductively coupled to said output circuit for producing an output signal of an intermediate frequency, a potential divider also connected across said pair of terminals; input signal coupling means connected between an intermediate point of said potential divider and another electrode of said transistor; and positive feedback path means connected from said output signal means to said intermediate point of the potential divider for neutralizing the degenerative effect of said resistor-capacitor combination to improve the gain at intermediate frequencies and improve the conversion gain of the converter at high frequencies.

2. The invention of claim 1 wherein are means for bypassing current fed back along the feedback path at the input signal and heterodyne frequencies.

3. The invention of claim 1 wherein the heterodyne signal means comprises a capacitor and an inductor.

References Cited in the file of this patent

UNITED STATES PATENTS

| | | |
|---|---|---|
| 2,582,683 | Dammers | Jan. 15, 1952 |
| 2,653,224 | Vilkomerson | Sept. 22, 1953 |
| 2,808,505 | Cantz et al. | Oct. 1, 1957 |
| 2,812,432 | Boekhorst | Nov. 5, 1957 |
| 2,828,410 | Rungen | Mar. 25, 1958 |
| 2,835,797 | Boekhorst | May 20, 1958 |
| 2,928,936 | Bock | Mar. 15, 1960 |
| 2,940,051 | Korn et al. | June 7, 1960 |